United States Patent
Ridder

(10) Patent No.: US 10,008,401 B2
(45) Date of Patent: Jun. 26, 2018

(54) WAFER BOAT HAVING DUAL PITCH

(71) Applicant: ASM IP Holding B.V., Almere (NL)

(72) Inventor: de Chris G. M. Ridder, Almere (NL)

(73) Assignee: ASM IP HOLDING B.V., Almere (NL)

( * ) Notice: Subject to any disclaimer, the term of this patent is extended or adjusted under 35 U.S.C. 154(b) by 1181 days.

(21) Appl. No.: 13/859,020

(22) Filed: Apr. 9, 2013

(65) Prior Publication Data
US 2014/0302447 A1    Oct. 9, 2014

(51) Int. Cl.
*H01L 21/673* (2006.01)

(52) U.S. Cl.
CPC .............. *H01L 21/67309* (2013.01)

(58) Field of Classification Search
None
See application file for complete search history.

(56) References Cited

U.S. PATENT DOCUMENTS

| | | | |
|---|---|---|---|
| 4,515,104 A * | 5/1985 | Lee | 118/500 |
| 5,492,229 A * | 2/1996 | Tanaka et al. | 211/41.18 |
| 5,921,773 A * | 7/1999 | Lee | 432/258 |
| 6,110,285 A * | 8/2000 | Kitazawa et al. | 118/715 |
| 6,240,875 B1 | 6/2001 | Van Wijck | |
| 2003/0049372 A1 * | 3/2003 | Cook et al. | 427/248.1 |
| 2003/0098047 A1 * | 5/2003 | Herbst | H01L 21/67057 134/25.4 |
| 2006/0150904 A1 * | 7/2006 | Ozaki et al. | 118/715 |
| 2008/0035055 A1 * | 2/2008 | Dip et al. | 118/715 |
| 2011/0005967 A1 * | 1/2011 | Gregerson et al. | 206/711 |
| 2013/0284683 A1 * | 10/2013 | Jdira et al. | 211/41.18 |
| 2015/0084204 A1 * | 3/2015 | Yun | H01L 23/481 257/773 |

FOREIGN PATENT DOCUMENTS

JP         2000232151 A  *  8/2000  .............. H01L 21/68

* cited by examiner

*Primary Examiner* — Alissa Tompkins
*Assistant Examiner* — John Bargero
(74) *Attorney, Agent, or Firm* — Lex IP Meister, PLLC

(57) ABSTRACT

A wafer boat is provided for holding a plurality of wafers in a vertically stacked and spaced relationship. The wafer boat comprises a top member; a bottom member facing the top member; and at least three vertical members extending between the top member and the bottom member. The vertical members are provided with a plurality of protrusions, the protrusions configured to form a plurality of wafer accommodations at different vertical heights, the protrusions configured to be arranged in groups of at least two protrusions. A pitch of protrusions within a group has a first value and a pitch of two adjacent protrusions that belong to different groups has a second value larger than the first value.

14 Claims, 4 Drawing Sheets

WAFER BOAT HAVING DUAL PITCH

BACKGROUND (a) Technical Field

This disclosure relates to the field of semiconductor processing and, more specifically, to wafer boats used in vertical furnaces.

(b) Description of the Related Art

In semiconductor processing, vertical wafer boats are used to hold a plurality of semiconductor wafers in a vertically stacked spaced relationship for processing in a vertical furnace. The wafer boats respectively comprise three or more vertical members which extend between a top member and a bottom member. The vertical members are provided with a plurality of vertically spaced recesses and the bottom surfaces of the recesses form support surfaces for the wafers. The recesses have a constant pitch over substantially an entire height of the wafer boat. The wafer boat is configured such that a wafer can be inserted into a wafer accommodation between two side vertical members from the front side, which is opposite the one or more back vertical members. The total number of wafers that can be processed simultaneously, or the load size, follows from the length of the furnace that provides a flat temperature profile that can be used for processing divided by the interval, or pitch at which the wafers are placed. In some processes the wafer pitch influences the process results, such as in CVD processes where the within wafer uniformity is influenced by the wafer pitch and the minimum usable pitch is determined by the process requirements. In other processes such as oxidation, anneal and curing processes the wafer pitch has limited or no influence on the process results and the minimum usable pitch is determined by the space that is required for loading and unloading the wafers into and from the wafer boat. The space required is determined by the thickness of the end effector, the bow of the end effector and the wafer, and the tolerances in the dimensions of the wafer boat and the accuracy of the wafer handling robot. With increasing wafer size, the weight of the wafer increases and the thickness of the end effector increases. Further, as the increase of the thickness of the wafer is less than proportional to the increase of the diameter of the wafer, the bow of the wafer increases. As a result, for 300 mm wafers and 450 mm wafers the minimum required handling space is significantly larger than for smaller wafers. Correspondingly, the total wafer load that can be accommodated in a furnace having a certain flat-zone length decreases.

SUMMARY

According to an aspect of the present invention, a wafer boat is provided for holding a plurality of wafers in a vertically stacked and spaced relationship. The wafer boat comprises a top member; a bottom member facing the top member; and at least three vertical members extending between the top member and the bottom member, wherein the vertical members are provided with a plurality of protrusions, the protrusions configured to form a plurality of wafer accommodations at different vertical heights, the protrusions configured to be arranged in groups of at least two protrusions, and wherein a pitch of protrusions within a group has a first value and a pitch of two adjacent protrusions that belong to different groups has a second value larger than the first value.

According to another aspect of the present invention, a wafer boat is provided for holding a plurality of wafers in a vertically stacked and spaced relationship. The wafer boat comprises a top member; a bottom member facing the top member; and at least three vertical members extending between the top member and the bottom member, wherein the vertical members are provided with a plurality of recesses, the recesses configured to form a plurality of wafer accommodations at different vertical heights, wherein the recesses comprise a plurality of first recesses having a first height and a plurality of second recesses having a second height larger than the first height.

DETAILED DESCRIPTION OF THE EMBODIMENTS

Advantages and features of the present invention and methods to achieve them will be elucidated from exemplary embodiments described below in detail with reference to the accompanying drawings. However, the present invention is not limited to exemplary embodiment disclosed herein but may be implemented in various forms. The exemplary embodiments are provided by way of example only so that a person of ordinary skill in the art can fully understand the disclosures of the present invention and the scope of the present invention. Therefore, the present invention will be defined only by the scope of the appended claims.

A wafer boat according to an exemplary embodiment of the present invention will now be described with reference to accompanying drawings.

Figure 1:
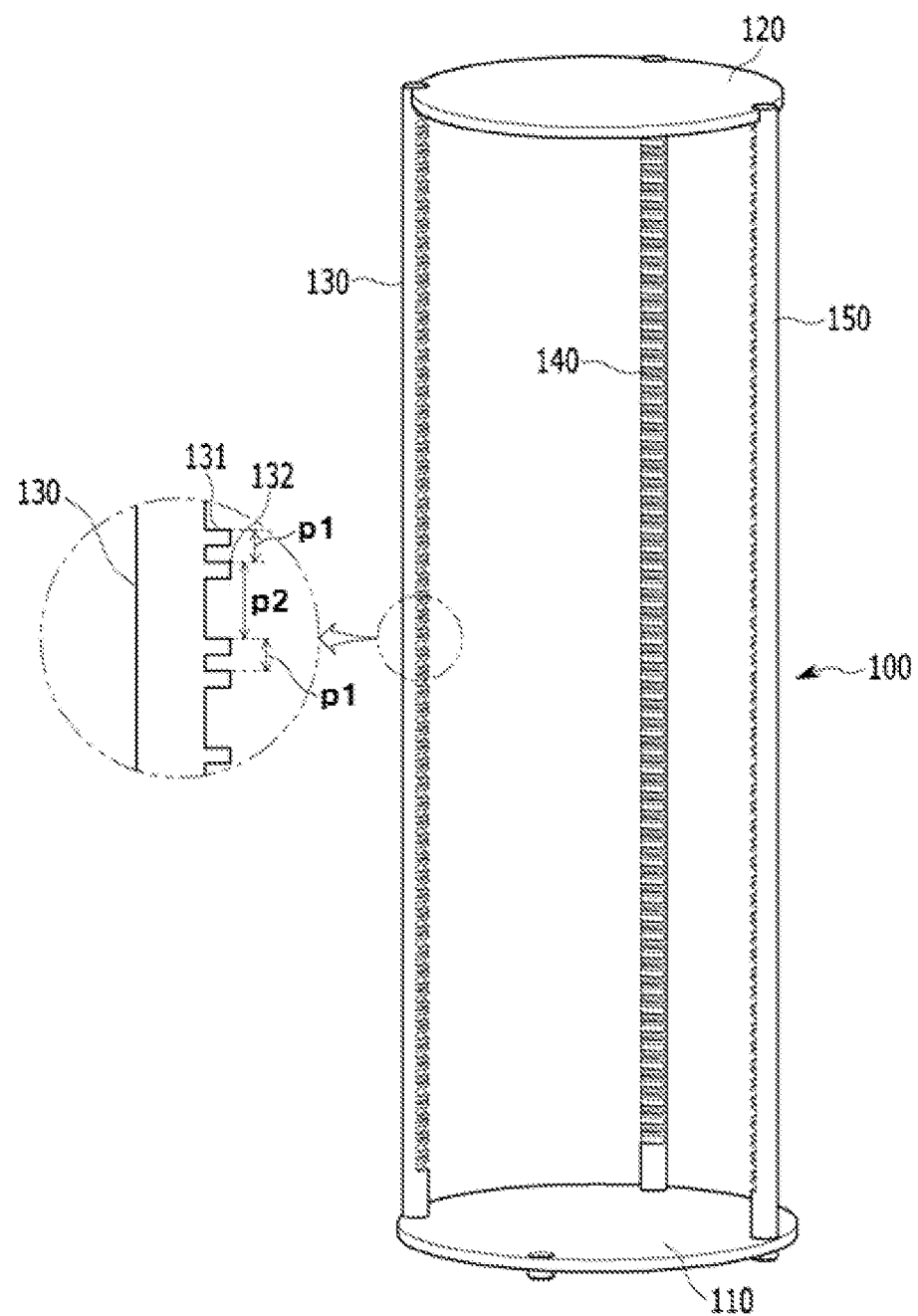
FIG. 1 is a perspective view of a wafer boat according to an exemplary embodiment of the present invention.

FIG. 1 is a perspective view of a wafer boat according to an exemplary embodiment of the present invention.

The wafer boat 100 comprises a bottom plate 110, a top plate 120, and three vertical rods 130, 140, and 150 which respectively extend between the top plate 120 and the bottom plate 110. The bottom plate 110 and the top plate 120 have a disc shape in this embodiment but may have different shapes such as a square. The three vertical rods 130, 140, and 150 have cylindrical shape in this embodiment but may have different shapes such as a square column or a triangular prism. And, the number of the vertical rods may be four or more. Two rods are positioned as side rods opposite to each other with respect to the bottom plate 110 and the top plate 120. One rod is disposed at a back side of the wafer boat 100 to stop and support wafers inserted from a front side of the wafer boat 100 between the two side rods. The three vertical rods 130, 140, and 150 extending between the top plate 120 and the bottom plate 110 form wafer accommodations. The wafer boat is made of quartz, but may also be made of other materials such as Silicon Carbide, silicon or a ceramic material.

The vertical rods 130, 140, and 150 are provided with a plurality of vertically spaced protrusions 131 and 132 which are provided by forming recesses on the vertical rods 130, 140, and 150. The protrusions 131 and 132 are formed by the non-recessed portions of vertical rods 130, 140 and 150 and support the wafers when the wafers are accommodated in the wafer boat 100. The protrusions 131 and 132 are vertically spaced apart with two different distances (hereinafter, called "pitches", p1 and p2) over substantially an entire height of the wafer boat 100. The protrusions 131 and 132 are arranged in groups each having two protrusions 131 and 132. The pitch p1 between two protrusions 131 and 132 in a group is smaller than the pitch p2 between two protrusions 131 and 132 which belong to different groups. The pitch p2 is determined by considering the thickness of the end effector which will be used, the bow of the end effector and the wafer, and the tolerances in the dimensions of the wafer boat 100 and the accuracy of the wafer handling robot, so that sufficient space is available to insert an end effector between two wafers accommodated in the boat at pitch p2. The pitch p1 may be determined by considering merely the thicknesses of the wafer and the space required for inserting or removing a wafer into/from the wafer boat and the minimum required height of protrusions 131 and 132 that provides sufficient mechanical strength. The protrusions 131 and 132 have the same height in this embodiment but may have different heights. The recesses forming the protrusions 131 and 132 include a first recess having a first height and a second recess having a second height larger than the first height. The first recess and the second recess are alternatively arranged substantially throughout the vertical rods 130, 140, and 150. When the wafers are accommodated in the wafer boat 100, edges of the wafers are inserted in the recesses and are supported by the protrusions 131 and 132.

Figure 2:
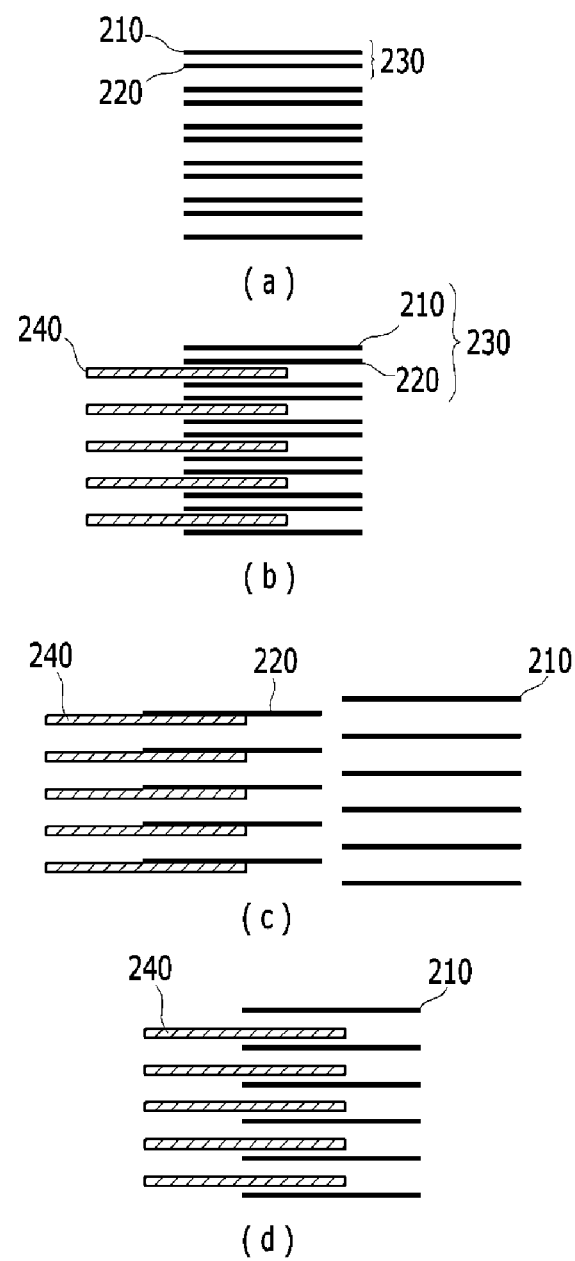
FIG. 2 is a schematic view showing an unloading sequence for a wafer boat according to an exemplary embodiment of the present invention.

FIG. 2 is a schematic view showing an unloading sequence for a wafer boat according to an exemplary embodiment of the present invention.

a) of FIG. 2 schematically shows wafers 210 and 220 loaded in the wafer boat of FIG. 1. The wafers 210 and 220 loaded in the wafer boat are arranged in groups 230. Each of the groups 230 comprises a top wafer 210 and a bottom wafer 220. The distance between the wafers 210 and 220 within a group has a first value. The distance between the wafers 210 and 220 belonged to adjacent different groups 230 has a second value, the second value being greater than the first value. The first value may be so small that it may not provide sufficient space for wafer handling and the second value is so large that it provides sufficient space for wafer handling.

In b) of FIG. 2, the first step of the unloading sequence is shown. A wafer handler having at least two end effectors 240 is inserted in the space below the bottom wafer 220 of a group 230. The space below the bottom wafer 220 in a group 230 is larger than the space between adjacent wafers 210 and 220 within a group 230 and is sufficient for inserting the end effector 240 and for the subsequent movement of the bottom wafers 220. In the example a wafer handler is shown having 5 vertically spaced end effectors 240. However, a wafer handler having another plurality of end effectors may be used.

In c) of FIG. 2, the bottom wafers 220 have been retracted from the wafer boat and only the top wafers 210 are left in the wafer boat. The top wafers 210 left in the wafer boat, without the bottom wafers 220 being present, have a sufficiently large free space below them to facilitate wafer handling.

In d) of FIG. 2, the end effectors 240 are inserted between the remaining wafers 210. The end effectors 240 can engage and retract the wafers 210 from the wafer boat.

For loading wafers on the wafer boat, a reverse order of actions may be applied. Namely, the top wafers 210 are firstly loaded and then the bottom wafers 220 are loaded.

The wafer handler is a commercially available wafer handler comprising 5 wafer end effectors. The pitch between the end effectors is adjustable and can be adjusted between a value for removing wafers from the wafer boat or loading wafers into the wafer boat and a value for delivering wafers to or removing wafers from a wafer transport cassette.

Figure 3:
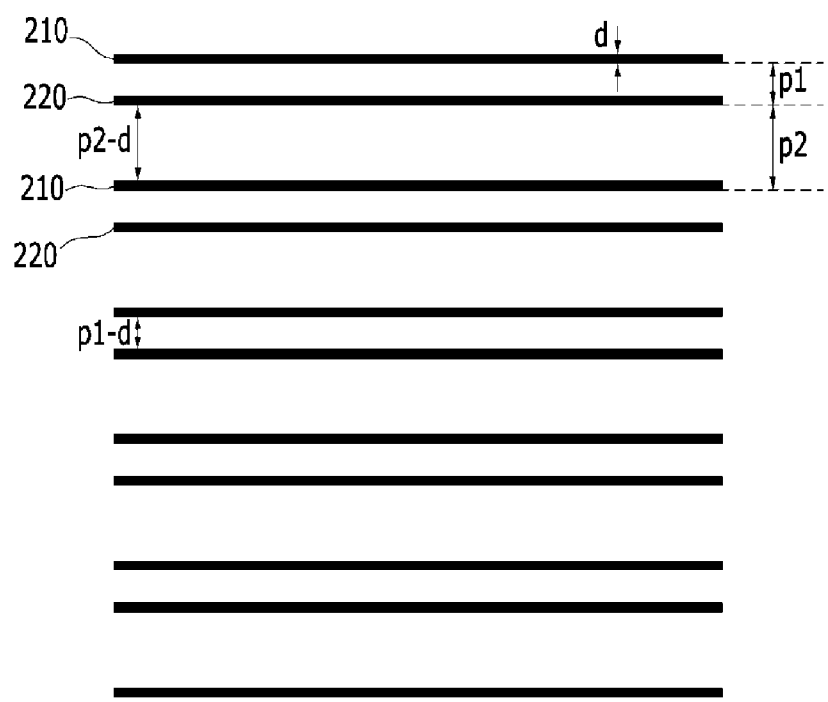
FIG. 3 is a schematic view showing wafers loaded on a wafer boat according to an exemplary embodiment of the present invention.

FIG. 3 is a schematic view showing wafers loaded on a wafer boat according to an exemplary embodiment of the present invention.

In FIGS. 1 and 3, the pitch dimensions for a wafer boat 100 with a group-wise arrangement of the protrusions 131 and 132 and a group size of two are shown in further detail. The pitch of protrusions 131 and 132, and hence the pitch of wafers 210 and 220 within a group is p1 and the pitch of two adjacent protrusions 131 and 132 wherein each protrusion belongs to a different group is p2, wherein p2>p1. The thickness of a wafer is d. The pitch is the repetitive mutual spacing of items. It is the spacing e.g. from the bottom of a recess or wafer (the top of a protrusion) to the bottom of an adjacent recess or wafer (the top of an adjacent protrusion). The free space between wafers 210 and 220 within a group is p1−d and the free space between the top wafer 210 of a first group and the bottom wafer 220 of the next higher group is p2−d, wherein d is the thickness of a wafer.

For example, for 450 mm silicon wafers, the pitch p in a conventional boat may be 7.3 mm and the wafer thickness d may be 0.95 mm. This results in a free space between wafers of p−d=7.3−0.95=6.35. This may be insufficient for wafer handling. It should be taken into account that the wafer is supported on a protrusion that is formed by material that is left between adjacent recesses. The thickness of this protrusion may be about 2 mm or more to provide a sufficiently robust support that is not fragile and does not easily break. As a consequence, the height of a recess in this example is 7.3−2=5.3 mm. Further, an exemplary thickness of an end effector may be 2 mm. The free available space for handling of a wafer is the height of the recess minus the thickness of the wafers, minus the thickness of the end effector: 5.3−0.95−2=2.35. During movement of the wafer, this space is preferably about equally divided above and below the wafer, resulting in just over 1 mm free space at either side for handling, which seems not enough for handling without problems.

The limitation of the minimum required handling space may be overcome by loading the wafers one by one, starting at the top and ending at the bottom. Then, for all wafers, plenty of space is available below the wafers for wafer handling. Unloading of the wafer boat may be done in the reverse order, starting at the bottom of the wafer boat. However, loading one wafer at a time is very time consuming and confines the throughput of a vertical furnace. Therefore, in commercially available systems, two or more wafers, typically 5 wafers are needed to be transferred simultaneously.

In the wafer boat 100 according to FIG. 1, the protrusions 131 and 132 are arranged in groups of two protrusions. The pitch p1 within a group may be 6.55 mm and the wafer thickness d may be 0.95 mm resulting in a free space between wafers of p1−d=6.55−0.95=5.6 mm. The pitch p2 between adjacent protrusions 131 and 132 of different groups may be 8.05 mm, the wafer thickness d may be 0.95 mm and the free space between wafers is p2−d=8.05−0.95=7.1 mm. For the free space of handling the wafer in a recess we have to subtract the thickness of the protrusion, 2 mm and the thickness of the wafer handler, 2 mm resulting in a free space for handling of 3.1 mm . This may be sufficient space for wafer handling. In this example, the average pitch is (6.55+8.05)/2 mm=14.6/2 mm=7.3 mm. This is the same pitch as the conventional boat of this example. The wafer boat shown in FIG. 1 provides more space sufficient for handling wafers than the conventional boat by employing a dual pitch structure. As a result, an exemplary embodiment of the present invention allows using smaller average pitches than those allowable in the conventional boats, thereby resulting in a larger load size of wafers that can be accommodated in a boat of a given length. In this example the difference between p1 and p2 is 1.5 mm. The difference between a first value of the pitch, p1, and a second value of the pitch, p2 is preferably 1 mm or more and may be 2 mm or more.

Figure 4:
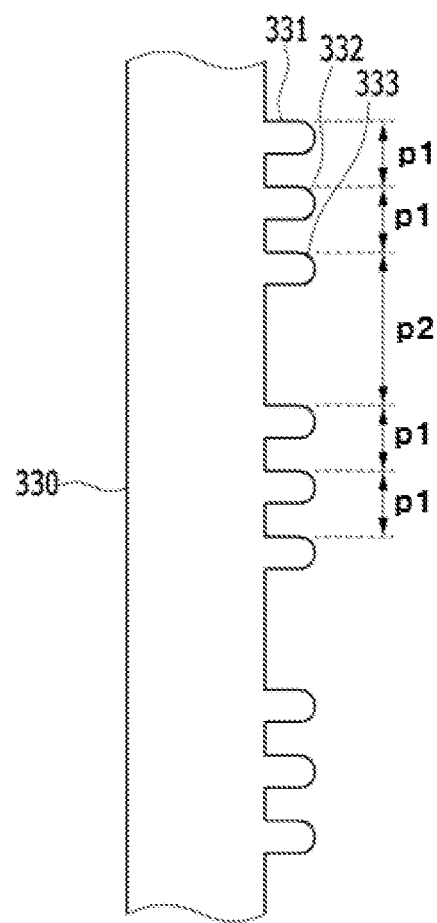
FIG. 4 is a partial view of a wafer boat according to another exemplary embodiment of the present invention.

FIG. 4 is a partial view of a wafer boat according to another exemplary embodiment of the present invention. FIG. 4 shows a portion of a vertical rod 330 in a wafer boat.

The group size of protrusions of a wafer boat may be three or more. In FIG. 4, each group includes three protrusions 331, 332, and 333. The protrusions 331, 332, and 333 support the wafers when the wafers are accommodated in the wafer boat. The protrusions 331, 332, and 333 are vertically spaced apart with two different pitches p1 and p2 over substantially an entire height of the wafer boat. The pitch p1 between two protrusions in a group is smaller than the pitch p2 between two protrusions which belong to different groups. The recesses spacing apart the protrusions 331, 332, and 333 include a first recess having a first height and a second recess having a second height larger than the first height. The first recess spaces apart the protrusions 331, 332, and 333 within a group and the second recess spaces apart the bottom protrusion 333 of a group and the top protrusion 331 of the adjacent below group. The protrusions 331, 332, and 333 have rounded ends to avoid possible scratch or cracking. However, the protrusions 331, 332, and 333 may have angulated ends. On the other hand, the protrusions 131 and 132 of FIG. 1 may have rounded ends.

A larger group size requires a wafer handler with a larger maximum span between two adjacent end effectors. The maximum span of the currently used commercial wafer handler is available for the group size of two. However, a wafer handler available for the group size of three or more may be developed.

In the embodiments of FIGS. 1 and 4, the height of the protrusions is substantially constant and the height of the recesses has been varied. Alternatively, the height of the recesses may be substantially constant and the height of the protrusions may be varied.

According to the exemplary embodiments of the present invention, wafer boats that allow handling of a plurality of wafers simultaneously and reducing the average wafer pitch while still providing sufficient space for wafer handling are provided.

It will be apparent to those skilled in the art that various modifications and variations can be made in the present invention without departing from the scope or spirit of the invention. Thus, it is intended that the present invention cover the modifications and variations of this invention provided that they come within the scope of the appended claims or their equivalents.

What is claimed is:

1. A wafer boat for holding a plurality of wafers in a vertically stacked and spaced relationship, comprising:
   a top member;
   a bottom member facing the top member; and
   at least three vertical members extending between the top member and the bottom member,
   wherein the vertical members are provided with a plurality of protrusions, the protrusions configured to form a plurality of wafer accommodations at different vertical heights, the protrusions configured to be arranged in groups of at least two protrusions,
   wherein a pitch of protrusions within a group has a first value and a pitch of two vertically adjacent protrusions that belong to different groups has a second value larger than the first value.

2. The wafer boat of claim 1, wherein the difference between the first value and the second value is 1 mm or more.

3. The wafer boat of claim 1, wherein the difference between the first value and the second value is 2 mm or more.

4. The wafer boat of claim 1, wherein each of the groups comprises five or less protrusions.

5. The wafer boat of claim 1, wherein each of the groups comprises three or more protrusions.

6. The wafer boat of claim 1, wherein the wafer boat is made of a material selected from the group of quartz, silicon carbide, and silicon.

7. The wafer boat of claim 1, wherein ends of the protrusions are rounded.

8. The wafer boat of claim 1 wherein the protrusions have a constant height.

9. The wafer boat of claim 1 wherein the protrusions are provided by forming recesses on the vertical members.

10. The wafer boat of claim 9, wherein the first recesses and the second recesses are alternately arranged.

11. The wafer boat of claim 9, wherein each of the second recesses is disposed between groups of the first recesses, each of the groups including at least two first recesses.

12. The wafer boat of claim 9, wherein the difference between the first height and the second height is 1 mm or more.

13. The wafer boat of claim 9, wherein the difference between the first height and the second height is 2 mm or more.

14. The wafer boat of claim 9 wherein the non-recessed parts in between recesses have a constant height.

* * * * *